(12) United States Patent
Gauthier et al.

(10) Patent No.: US 6,556,041 B1
(45) Date of Patent: Apr. 29, 2003

(54) REDUCING PECL VOLTAGE VARIATION

(75) Inventors: Claude R. Gauthier, Fremont, CA (US); Pradeep R. Trivedi, Sunnyvale, CA (US); Dean Liu, Sunnyvale, CA (US); Brian Amick, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/978,869

(22) Filed: Oct. 16, 2001

(51) Int. Cl.[7] .................. H03K 17/16; H03K 19/094
(52) U.S. Cl. .................. 326/33; 326/73; 326/74; 326/27
(58) Field of Search ................ 326/33, 66, 67, 326/73, 74, 77, 78, 83, 27, 112

(56) References Cited

U.S. PATENT DOCUMENTS 5,633,602 A * 5/1997 Sanwo et al. ............... 326/73
5,874,837 A * 2/1999 Manohar et al. ............ 326/83

* cited by examiner

Primary Examiner—Daniel Chang
(74) Attorney, Agent, or Firm—Rosenthal & Osha L.L.P.

(57) ABSTRACT

A method for reducing voltage variation in a PECL based component has been developed. The method includes powering up a PECL based component, such as a receiver circuit for a PLL, and activating or inserting a shunting resistance across the power supply terminals of a PECL power supply. The shunting resistance is inserted in parallel with the PECL based component, and is controllable such that the resistance can be selectively switched 'on' and/or 'off.'

22 Claims, 2 Drawing Sheets

REDUCING PECL VOLTAGE VARIATION

BACKGROUND OF INVENTION

1. Field of the Invention

The invention relates generally to circuit design. More particularly, this invention relates to a method for reducing PECL voltage variation.

2. Background Art

In electronic circuits, the system power supply can be shown as an equivalent circuit 10 as shown in FIG. 1. Specifically, the equivalent circuit 10 includes: a system power supply source 12; a system resistance (Rs) 14; a system inductance (Ls) 16; and a chip capacitance (Rc) 18. Each of these system components 12, 14, 16, and 18 represent an equivalent value of all of the combined respective components in the power supply system. The performance of the circuit 10 is frequency dependent. As shown in the graph of FIG. 2, as the frequency of the system increases, the resistance of the circuit increases as well. This increase in resistance continues until a peak 20 is reached at a resonance frequency. Finally, the resistance will subside at even higher frequencies.

The rate of increase in the resistance of the circuit as the frequency approaches its resonance value is quantified as a "Q" value. The "Q" value is calculated as $Q=((L/C))/R$; where L is the system inductance value; where C is the system capacitance value; and where R is the system resistance value. As shown in FIG. 2, under normal operations, the equivalent circuit 10 has a very high Q value 24 near the resonance frequency. A high current transient with the high Q region of the frequency band causes significant noise in the power supply system. Supply noise can result in such problems as voltage variation, signal jitter, signal stability, component or logic malfunction, signal interference, etc. For instance, a PLL circuit will have more jitter in the presence of power supply noise, which effectively leads to a reduction in the speed at which a chip can operate. Voltage variation is a significant problem because the indeterministic distribution of power to system components can lead to a loss of system performance.

It would be advantageous to decrease the Q value of the power supply system and thereby reduce voltage variation. A reduced Q value 26 is also shown in FIG. 2. This Q value 26 would have the advantage of substantially reducing the voltage variation of the respective system. FIG. 3 shows a prior art method of reducing the Q value for a positive emitter coupled logic ("PECL") power supply system. PECL involves standard emitter coupled logic devices running off a positive power supply. Thus, components powered by PECL usually operate of partial swing signals as opposed to full swing signals. Typically, PECL is used for a receiver circuit 32 that inputs a partial swing system clock and outputs a full swing system clock to a phase locked loop ("PLL") (not shown). However, although PECL is fast, the use of PECL for the receiver circuit to the PLL introduces jitter on the clock signal from the receiver circuit to the PLL.

The receiver circuit 32 is just one of many types of components that are commonly included in an integrated circuit. Each of these components often has a dedicated power supply that is unique and separate from the power supplies of other components. The prior art method used in FIG. 3 involves inserting a de-coupling capacitor 34 across the power supply in parallel with the receiver 32. However, the capacitor 34 takes up a significant amount of space on the chip. With chip space at a premium, a space efficient method of reducing voltage variation for a circuit using PECL voltage is needed.

SUMMARY OF INVENTION

According to one aspect of the present invention, a method for reducing voltage variation in a PECL based component comprises supplying power to the PECL based component and connecting a resistance in parallel with the PECL based component.

According to another aspect, a method for reducing voltage variation in a PECL based component comprises a step of supplying power to the PECL based component and a step of shunting a resistance in parallel with the PECL based component.

According to another aspect, an apparatus for reducing voltage variation in PECL based component comprises means for supplying power to the PECL based component and means for connecting an impedance in parallel with the PECL based component.

Other aspects and advantages of the invention will be apparent from the following description and the appended claims.

DETAILED DESCRIPTION

Figure 1:
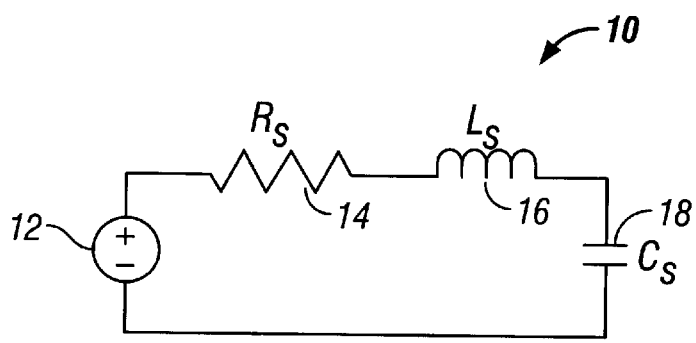
FIG. 1 shows a prior art embodiment of an RLC equivalent power supply system circuit.
Figure 2:
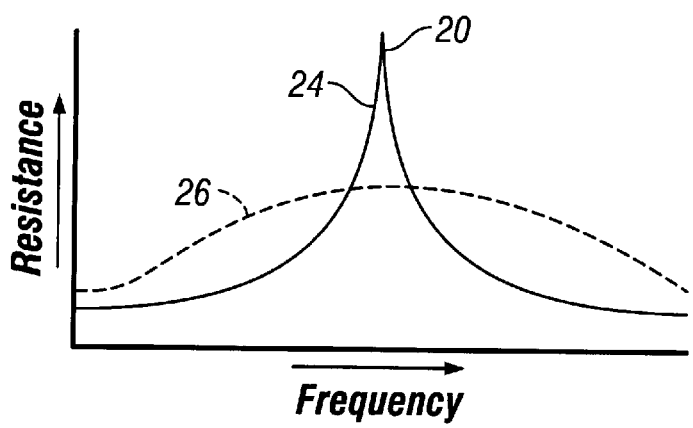
FIG. 2 shows a prior art graph of resistance versus frequency for the circuit shown in FIG. 1.
Figure 3:
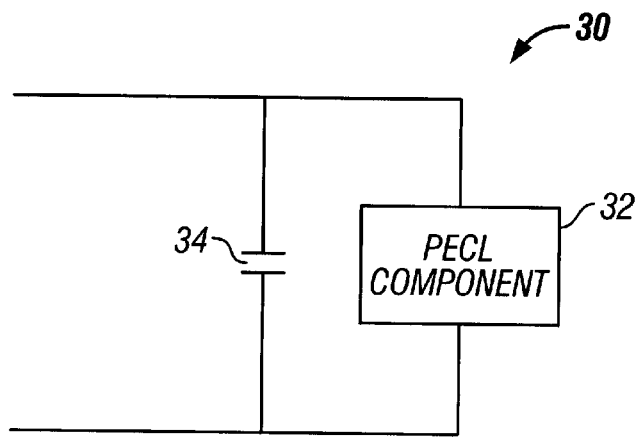
FIG. 3 shows a prior art schematic of a PECL based component with a de-coupling capacitor.
Figure 4:
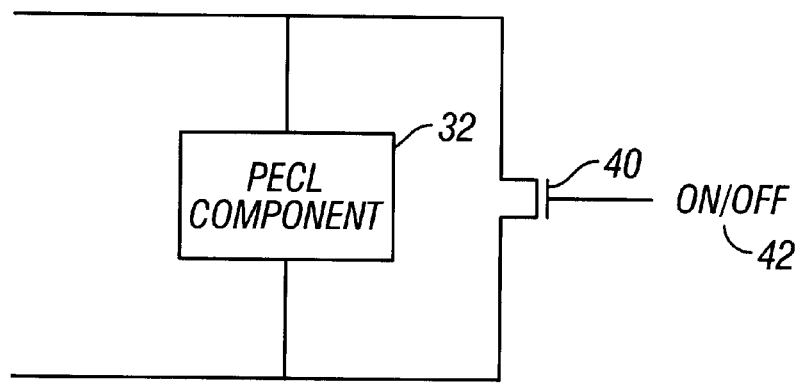
FIG. 4 shows a shunting resistance in accordance with an embodiment of the present invention.

FIG. 4 shows a schematic of one embodiment of the present invention with a parallel shunting resistance. The circuit includes: a PECL based component 32, and a shunting resistance component 40. The shunting resistor 40 is located in parallel with the PECL based component 32. In this embodiment, the shunting resistance 40 is shown as an N-type transistor which means that the transistor is "on" (allows current to pass) when the ON/OFF signal 42 is "high". Conversely, the transistor 58 is "off"(does not allow current to pass) when the ON/OFF signal 42 is "low.

The effect of adding a resistance value in parallel to the component served by the power supply system has the effect is to lower the Q value and consequently lower the voltage variation across the PECL based component 32. In one embodiment, the PECL based component 32 may be a receiver circuit for a PLL, where decreasing the voltage variation across the PECL based component 32 leads to a reduction of jitter on an output signal from the receiver circuit to a PLL (not shown), effectively leading to less clock jitter on the clock signal output from the PLL. Those skilled in the art will appreciate that a reduction of voltage variation by 50% may result in a corresponding reduction in clock jitter of 50%. In this embodiment, a transistor is used to provide a small amount of resistance to lower the Q value of the PECL power supply. In this embodiment, the transistor is controlled with an ON/OFF signal 42. When the ON signal is activated, the transistor makes a connection in parallel across the power supply of the PECL based component 32. The connection allows current to flow through the transistor, which acts as a relatively small resistor.

Figure 5:
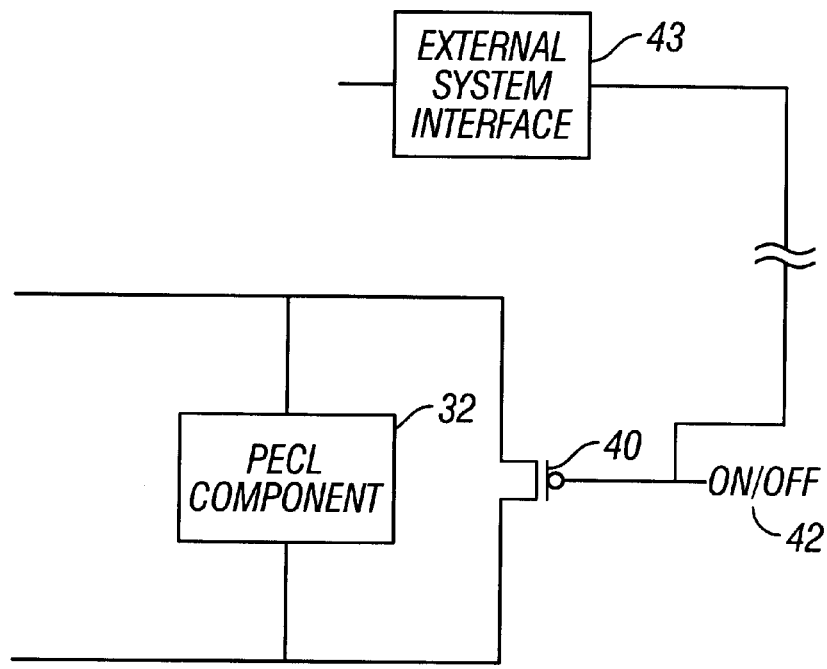
FIG. 5 shows a shunting resistance in accordance with an alternative embodiment of the present invention.

FIG. 5 shows a schematic of one embodiment of the present invention with a parallel shunting resistance. The circuit includes: a PECL based component 32, and a shunting resistance component 44 that is located in parallel with the PECL based component 32. However, in this embodiment, the shunting resistance component 44 is a "P-type" transistor which means that the transistor is "on" (allows current to pass) when the ON/OFF signal 42 is low. Conversely, the transistor 56 is "off" (does not allow current to pass) when the ON/OFF signal 42 is high or ON. The P-type transistor operates in the same manner as the N-type transistor, except that it is activated off by the inverse signals. Consequently, the circuit in shown in FIG. 5 will operate in the same manner as the circuit in FIG. 4 except that it will be turned ON and turned OFF by an inverted signals.

While each of these embodiments has shown the shunting resistance component as a transistor, it should be clear to those of ordinary skill in the art that alternative shunting devices could be used. For example, a simple resistor located in parallel with the receiver circuit could perform the same function. Alternatively, a variable resistor could be used as well. Additionally, a simple switch could be added in series with the alternative type of resistance to control the shunting operation.

The ON/OFF signal 42 may be connected to an external circuit interface 43. In some embodiments, an industry standard interface such as "JTAG" could be used. However, any other suitable interface known to those of ordinary skill in the art could also be used. The purpose of the external interface 43 is externally control of the shunt resistance. Alternatively, the ON/OFF signal 42 may be controlled by a particular program. In either event, the implementation of the ON/OFF signal 42 allows for greater flexibility in operating the circuit.

Advantages of the present invention may include one or more the following. In some embodiments, because a shunting resistance is positioned in parallel with a PECL based component, voltage variation in/across the PECL based component is reduced and jitter introduced by the component is accordingly reduced, effectively leading to reduced clock jitter and increased performance.

In some embodiments, because a shunting resistance positioned in parallel to a PECL based component is controllable, power consumption by the shunting resistance can be controlled and/or reduced.

In some embodiments, because a shunt regulation device uses a resistance instead of a capacitance, less integrated circuit area space is used.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for reducing voltage variation in a PECL based component, comprising:

supplying power to the PECL based component via a power supply power terminal and a power supply ground terminal; and connecting a resistance in parallel with the PECL based component, wherein the resistance is arranged to shunt the PECL based component across the power supply power terminal and the power supply ground terminal.

2. The method of claim 1, wherein the resistance comprises a transistor.

3. The method of claim 2, wherein the transistor comprises an N-type transistor.

4. The method of claim 2, wherein the transistor comprises a P-type transistor.

5. The method of claim 1, wherein the PECL based component is a receiver circuit for a PLL.

6. The method of claim 1, wherein the resistance is activated and de-activated independent of the PECL based component.

7. The method of claim 6, wherein the resistance is activated and de-activated by an external signal.

8. The method of claim 7, wherein the external signal is transmitted through an external system interface.

9. The method of claim 8, wherein the external system interface is a JTAG.

10. The method of claim 6, wherein the resistance is activated and de-activated by a computer program.

11. A method for reducing voltage variation in a PECL based component, comprising:

a step of supplying power to the PECL based component via a power supply power terminal and a power supply ground terminal; and a step of connecting a resistance in parallel with the PECL based component, wherein the resistance is arranged to shunt the PECL based component across the power supply power terminal and the power supply ground terminal.

12. An apparatus for decreasing clock jitter in a PECL based component, comprising:

a PECL based component;

a power supply system operatively connected to the PECL based component; and a shunting resistor connected in parallel with the PECL based component, wherein the shunting resistor is arranged to shunt the PECL based component across a power terminal of the power supply system and a ground terminal of the power supply system.

13. The apparatus of claim 12, wherein the PECL based component is a receiver circuit to a PLL.

14. The apparatus of claim 12, wherein the shunting resistor comprises a transistor.

15. The apparatus of claim 14, wherein the transistor comprises an N-type transistor.

16. The apparatus of claim 14, wherein the transistor comprises a P-type transistor.

17. The apparatus of claim 12, wherein the shunting resistor is activated and de-activated independent of the PECL based component.

18. The apparatus of claim 17, wherein the shunting resistor is activated and de-activated by an external signal.

19. The apparatus of claim 18, wherein the external signal is transmitted through an external system interface.

20. The method of claim 19, wherein the external system interface is a JTAG.

21. The method of claim 17, wherein the shunting resistor is activated and de-activated by a computer program.

22. An apparatus for reducing voltage variation in a PECL based component, comprising:

means for supplying power to the PECL based component via a power supply power terminal and a power supply ground terminal; and means for connecting an impedance in parallel with the PECL based component, wherein the impedance is arranged to shunt the PECL based component across the power supply power terminal and the power supply ground terminal.

* * * * *